United States Patent [19]

Kishi

[11] Patent Number: 4,654,554

[45] Date of Patent: Mar. 31, 1987

[54] PIEZOELECTRIC VIBRATING ELEMENTS AND PIEZOELECTRIC ELECTROACOUSTIC TRANSDUCERS

[75] Inventor: Kanesuke Kishi, Kanagawa, Japan

[73] Assignee: Sawafuji Dynameca Co., Ltd., Japan

[21] Appl. No.: 771,838

[22] Filed: Aug. 30, 1985

[30] Foreign Application Priority Data

| | | | |
|---|---|---|---|
| Sep. 5, 1984 | [JP] | Japan | 59-186979 |
| Dec. 24, 1984 | [JP] | Japan | 59-281381 |
| Feb. 20, 1985 | [JP] | Japan | 60-033511 |
| Jul. 12, 1985 | [JP] | Japan | 60-153616 |
| Jul. 12, 1985 | [JP] | Japan | 60-153617 |

[51] Int. Cl.[4] .............. H01L 41/08

[52] U.S. Cl. .............. 381/158; 310/345; 310/322; 381/190

[58] Field of Search .............. 310/321, 322, 324, 345; 179/110 A

[56] References Cited

U.S. PATENT DOCUMENTS

| | | | |
|---|---|---|---|
| 3,548,116 | 12/1970 | Schafft | 179/110 A |
| 3,732,446 | 5/1973 | Bryant | 310/321 X |
| 4,047,060 | 9/1977 | Schafft | 310/322 |
| 4,140,984 | 2/1979 | Imaguchi | 310/322 X |
| 4,283,605 | 8/1981 | Nakajima | 179/110 A |
| 4,401,857 | 8/1983 | Morikawa | 310/321 X |

*Primary Examiner*—Mark O. Budd

*Attorney, Agent, or Firm*—Wegner & Bretschneider

[57] ABSTRACT

A piezoelectric speaker including a plurality of piezoelectric vibrating elements, each including a piezoelectric vibrating plate and a weight connected to near the point of center of gravity thereof through a viscoelastic layer, and having the vibramotive force designed to be taken out of the outer edge thereof, which are connected at their peripheral ends to each other through connectors, one of said elements being connected at its peripheral edge directly to a cone type acoustic radiator to give thereto a vibramotive force mainly in a high-frequency portion, and the remaining elements adjacent thereto producing a vibramotive force adapted to share middle- and low-frequency portions for energization of said cone type acoustic radiator.

12 Claims, 47 Drawing Figures

PIEZOELECTRIC VIBRATING ELEMENTS AND PIEZOELECTRIC ELECTROACOUSTIC TRANSDUCERS

FIELD OF THE INVENTION

The present invention relates to a piezoelelctric vibrating element having a piezoelectric vibrating plate (or diaphragm) used for an electroacoustic transducer and a piezoelectric electroacoustic transducer wherein such a piezoelectric vibrating element is used.

BACKGROUND OF THE INVENTION

Ceramics includes many new materials worth of attention. Among others, close attention is now paid to a piezoelectric vibrating plate (or diaphragm) formed of a highly piezoelectric ceramic having a piezo effect, which excels in the electromechanical or mechanoelelctrical trasducing action. In many cases, the known piezoelectric vibrating plate comprises a single thin metal sheet on one or both sides of which is or are laminated a piezoelectric sheet or sheets consisting of a round thin piece of 20 to 30 mm in diameter and a highly piezoelectric ceramic composed such as of zirconium, lead titanate, etc. an an electrode surface provided on the surface thereof for polarization. FIG. 12 is a sectional view showing the basic motion of a piezoelectric vibrating plate 1 of the three-sheet structure, referred to as the bimorph. When a signal voltage e is applied in between the electrode surfaces of piezoelectric sheets 2*a* and 2*b* and a metal sheet 3, expansion/contraction stresses occur at the piezoelectric sheets 2*a* and 2*b* in the opposite directions, and are, in turn, converted into shear stresses acting in between them and the metal sheet 3, thus giving rise to a vertical vibramotive force F. If the outer edge is supprorted at a fulcrum 4, then the element 1 is subjected to the convex lens-like reference vibration mode according to which its central portion vibrates in the maximum amplitude. The sound output generated by such vibramotive force F may be used for the sound generators for piezoelectric buzzers, chimes, ringers, etc. Alternatively, as shown in FIG. 13, the piezoelectric vibrating plate 1 may be built in a case 6, and be joined at its center to the apex of a sound radiator 5 for driving so as to construct a small-sized speaker, etc.

As well-known in the art, a piezoelectric ceramic has an elastic modulus substantially comparable to that of quartz crystal ($E=83\times10^9$ (N/m$^2$)). The piezoelelctric vibrating plate 1 obtained by the lamination of its thin pieces onto the metal sheet 3 of the physical properties expressed in terms of reduced internal loss and high Q (sensitivity to resonance). For those reasons, it has a sharp resonance peak, and its resonance frequency $f_0$ is generally in a high-frequency range of about 2 to 5 kHz. Since ceramic is fragile, difficulty is involved in making it thin, however, to reduce the resonance frequency $F_0$ is practically difficult and is not economical.

Observation of the vibration phenomenon of the piezoelectric vibrating plate 1 at near the resonance point reveals, as shown in FIG. 14, the constant amplitude characteristic ($d_1$) in the stiffness motion zone on the low-frequency side of the resonance peak $f_{01}$, and the constant velocity characteristic ($V_1$) in the inertial motion zone on the high-frequency side. Now, let's presume the motion of a small-sized speaker, shown in FIG. 13, from an equivalent circuit diagram, shown in FIG. 15. Then the mechanical impedances $z_1$ and $z_0$ of the piezoelelctric vibrating plate 1 and the cone sound radiator 5 form together a series-connected circuit. In addition, $z_1$ is much higher than $z_0$. For those reasons, a velocity $V_0$ flowing in the cone sound radiator 5 is entirely governed by $z_1$, so that the movement of the radiator 5 is made similar to that shown in FIG. 14.

According to the acoustic theory, when it is desired to allow the acoustic radiator to radiate a constant sound pressure within a certain band in a free space, it is in principle required that the sound radiator vibrate at a constant velocity. Hence, referring to the radiating sound pressure characteristics of the conventional small-sized speaker of FIG. 13, a relatively high sound pressure is attained on the high-frequency side of the resonance point $f_0$, but, on the low-frequency side, the output sound pressure drops sharply with the frequency. As mentioned in the foregoing, since the resonance point $f_0$ of the piezoelectric vibtating plate 1 is found at about 2 to 5 kHz, the tone of reproduced sound becomes poor. This is because the high-frequency portion only is stressed, and the low-frequency portion is defficient. In addition, since the piezoelectric sheets 2*a* and 2*b* are of high Q, the resonance point $f_0$ is associated with a sharp resonance peak, and irregular responses occur with the frequent occurrence of high-harmonic strains, and the output sound pressure level drops in the middle- and low-frequency ranges. The resulting speaker is of no general use. In order to obviate such drawbacks, it has so far been proposed to, on the one hand, reduce $f_0$ with the use of a special large-sized piezoelectric vibrating plate, and on the other hand, apply a viscoelastic resin on the surface of the piezoelelctric sheets 2*a* and 2*b* or the vicinity of the fulcrum 4, whereby lowering Q. However, this is only an inefficient means, and is expected to be less effective. This is because $z_1$ is too high, and the resonance point $f_{01}$ is found near the upper limit of the audible range (3 to 5 kHz). To control freely this is not substantially possible at all by any conventional means.

SUMMARY OF THE INVENTION

A first object of the present invention is to provide a piezoelectric vibrating element designed to increase an output sound pressure in a low-frequency portion with the use of a normal piezoelectric vibrating plate that is of a relatively small size and easy to manufacture, thereby making the sound pressure flat.

A second object of the present invention is to provide a piezoelectric type transducer making use of such a piezoelectric vibrating element, which has an output sound pressure level comparable to that of the conventional permanent magnet type movable coil transducer, provides satisfactory acoustic characteristics over a reproducing range in an audible sound range without occurrence of any harmful peak, is made flat and thin in shape, and is decreased in weight.

A third object of the present invention is to provide a piezoelectric speaker to be used over a wide range, which includes a plurality of piezoelelctric vibrating elements and a cone type acoustic radiator to the top of which they are connected through the associated connectors so as to superpose vibramotive forces one upon another, said forces being obtained by the division of the reproducing range.

In order to achieve the foregoing object, the present invention provides a piezoelectric vibrating element in which a weight is connected to near the point of center of gravity of a piezoelelctric vibrating plate through a viscoelastic layer in such a manner that the vibromotive force or displacement oscillation of said piezoelelctric vibrating plate is mainly taken out of the outer edge thereof.

According to the present invention, there is also provided a piezoelectric speaker including a plurality of piezoelectric vibrating elements which are connected at their peripheral ends to each other through connectors, one of said elements being connected at its peripheral edge directly to an acoustic radiator to give thereto a vibramotive force mainly in a high-frequency portion, and the remaining elements adjacent thereto producing a vibramotive force adapted to share middle- and low-frequency portions for energization thereof.

Figure 3:
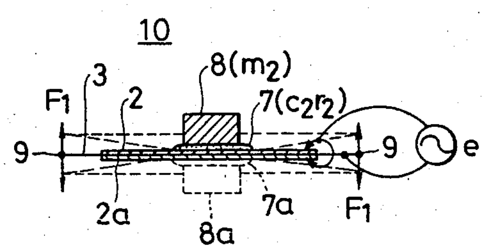
FIG. 3 is a view concretely illustrating the basic structure of the piezoelectric element according to the present invention.

This embodiment is illustrated in FIG. 3. Referring to a piezoelectric vibrating element 10 of the present invention, it is of a very simple structure wherein a weight 8($m_2$) having inertial mass $m_2$ is joined to, or in the vicinity of, the point of center of gravity of a piezoelectric vibrating plate 1 through viscoelastic layers 7 ($c_2$,$r_2$), said diaphragm being in principle constructed from a disk referred to as the so-called bimorph or unimorph in which piezoelectric sheets 2*a* and 2*b* are laminated upon both or one side of a metal plate 3.

Figure 1:
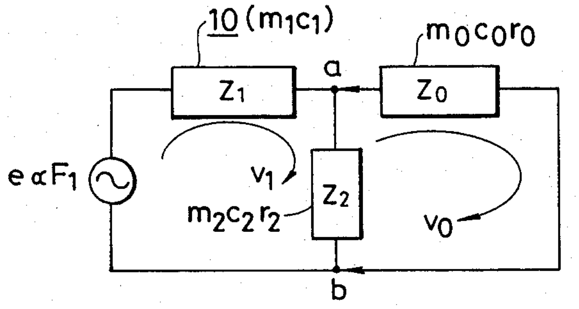
FIG. 1 is a an equivalent circuit diagram of the piezoelectric vibrating element according to the present invention.
Figure 2:
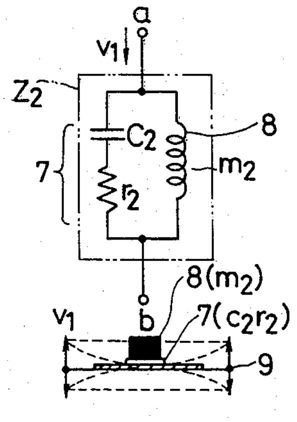
FIG. 2 is an equivalent circuit diagram wherein the variable impedance $z_2$ of FIG. 1 is shown as parallel elements for inertial mass $m_2$ and viscoelastic resistances $c_2$ and $r_2$.

Now, consideration is taken into the motion of the outer peripheries 9 caused by the application of a signal voltage e in between the electrode surfaces of the sheets 2*a*, 2*b* and the metal plate 3. In a low-frequency range (of no higher than 500 Hz), the piezoelectric vibrating plate is strongly restrained at the central portion, and takes on the concave lens mode, so that the outer periphery 9 vibrates to the maximum amplitude degree, since $z_2$ behaves as the mass reactance ($m_2$ in FIG. 2). In a middle-frequency range (of 500 Hz to 3 kHz), the respective reactances of the viscoelastic resistors $c_2$, $r_2$ and the inertial mass $m_2$ approach an equal value with a relative increase in $z_2$ and gradual removal of restrainment, so that the tangential line of vibration moves toward the outer periphery, resulting in the amplitude of a middle degree. In a high-frequency range (of no lower than 3 kHz), $z_2$ mainly behaves as the elastic resistance $c_2$ and the viscous resistance $r_2$, resulting in further considerable removal of restraint and allowing the vibration mode to pass into the convex lens mode.

Figure 4:
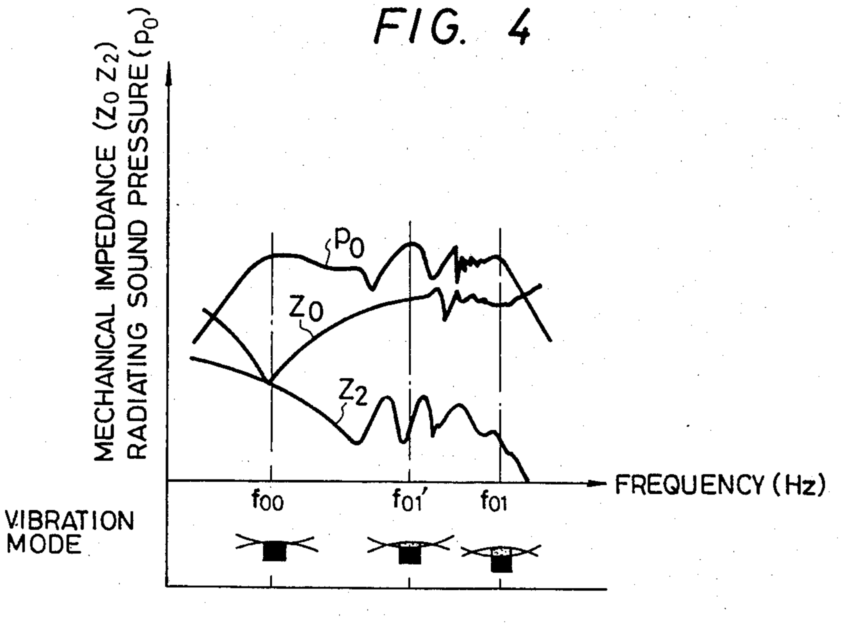
FIG. 4 is a characteristic diagram of the piezoelectric vibrating element shown in FIG. 3, FIGS. 5*a* to 5*f* are views showing several embodiments of the piezoelectric vibrating elements, in each of which a weight 7 is connected to a piezoelectric vibrating plate through a viscoelastic layer.
Figure 5A:
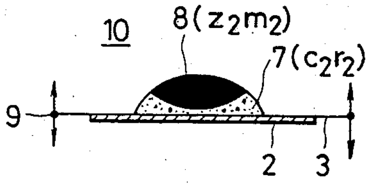
Figure 5B:
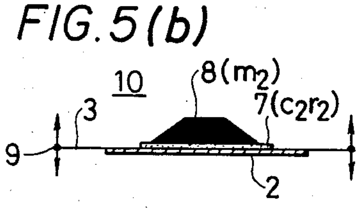
Figure 5C:
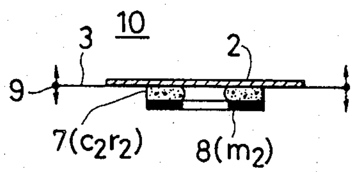
Figure 5D:
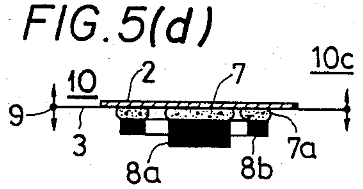
Figure 5E:
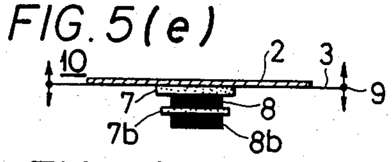
Figure 5F:
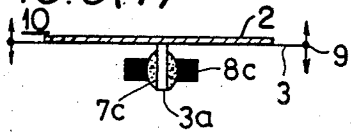

At the resonance point $f_{01}$, the viscous resistance $r_2$ then produces a braking effect to effectively prevent the formation of any resonance peak. FIG. 4 is illustrative of the vibration modes and the changes in $Z_2$ at three singular point $f_{00}$, $f'_{01}$ and $f_{01}$, wherein $f_{00}$ is the resonance point of a sound radiator, $f'_{01}$ is the resonance point resulting from the addition of $m_2$ forming $Z_2$ to $m_1$ of the piezoelectric plate 1 (about 1 kHz), and $f_{01}$ is the resonance point in the convex lens mode of the piezoelectric plate 1. A curve $z_0$ in FIG. 4 shows an impedance curve in the driving point of the sound radiator, and drops sharply from a middle frequency to $f_{00}$. As a result, the driving of the radiator is facilitated, to thereby help energize the vibration velocity $V_0$ and augment the low-frequency range portion. The foregoing motion renders it possible to control the vibration mode of the piezoelectric vibrating element 10 by the variable impedance $Z_2$ attached to the vicinity of the point of center of gravity thereof and to flatten substantially the vibration velocity $V_0$ and the radiating sound pressure $P_0$, of the sound radiator, to be applied upon the outer peripheries 9, as shown in FIG. 4.

Another considerable characteristic feature of the piezoelectric vibrating element 10 according to the present invention is that, unlike the conventional method in which a large resistance loss is inserted into an vibration circuit to mitigate any resonance peak and to achieve flat characteristics, the vibration mode is controlled under the action of the mechanical reactance of the variable impedance which varies corresponding to the frequency to obtain an approximately constant vibration velocity. Thus, due to very reduced circuit losses, the efficiency of the transducer is greatly increased.

In FIG. 3, the weight 8 may be formed of a flat lead ball having a weight of 1 to 5 grams, which may be divided into two portions for the provision therof on both sides of the piezoelectric vibrating plate 1, as indicated by broken lines. The viscoelastic layers 7 ($c_2$, $r_2$) may also be formed of mixtures of various synthetic rubber having invariable viscoelastic properties sufficient to support stably the weight 8 during motion, such as, for instance, butyl rubber, urethane rubber and silicone rubber with additives for adjustment of viscoelasticity, or foamed sheets formed thereof. In effect, since difficulty is now encountered in measuring the amount of dynamical viscoelasticity of these materials, their suitability has to be judged experimentally. Anyhow, it is desired to select a material having less temperature dependence.

FIG. 5(*a*) or 5(*b*) shows the sectional view of a further embodiment wherein the weight 8 is joined through the viscoelastic layer 7 to the piezoelectric vibrating plate 1 of the piezoelectric vibrating element 10 according to the present invention. As illustrated in FIG. 5(*a*), the weight 8 may be in the truncated fusi form taking the motion stability and adhesion thereof into account, and be mounted on a mono-morph type metal plate. As depicted in FIG. 5(*b*), the weight 8 may be in the truncated-conical form so as to enlarge the effective contact area of the viscoelastic layer 7 as well as to lower its center of gravity and, hence, increase its stability. Still alternatively, FIG. 5(*c*) shows a still further embodiment wherein the weight 8 is in the ring form, and is mounted in place by means of a viscoelastic layer 7 of a similar shape, said embodiment being designed to be applied to a relatively large weight. Referring to FIG. 5(*e*), the weight 8 is divided into a main part 8*a* and an annular subpart 8*b*, which are in turn concentrically arranged in place by means of viscoelastic layers 7*a* and 7*b* so as to prevent the occurrence of standing waves on the outside of the main part 8*a*. Turning to FIG. 5(*f*), the weight 8 and viscoelastic layers 7 are alternately laminated upon each other in divided fashion so as to disperse the effect of mass, thereby regulating the oscillation mode and achieve flatness within the motion range. Referring finally to FIG. 5(*f*), a thin tube 3*a* is vertically provided on the metal plate 3, and is fitted thereover with a tubular weight 8*c* having a tubular viscoelastic layer 7*c* inserted therethrough so as to make use of slip stress, thereby coping with a large amplitude.

Figures 6A, 6B:
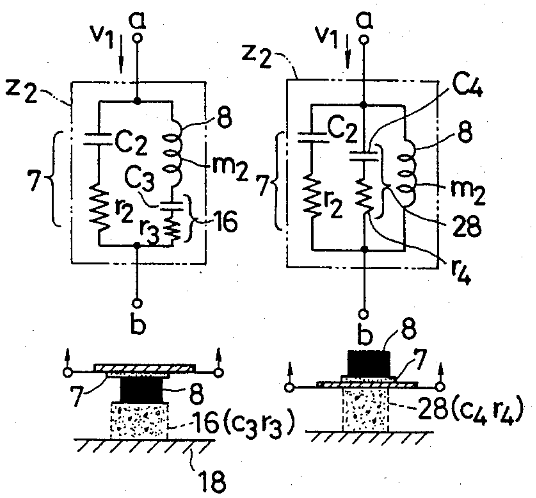
FIGS. 6*a* and 6*b* are views showing the piezoelectric vibrating elements according to the present invention, in which a pad is inserted between a weight or a piezoelectric vibrating plate and a fixing member.
Figure 7:
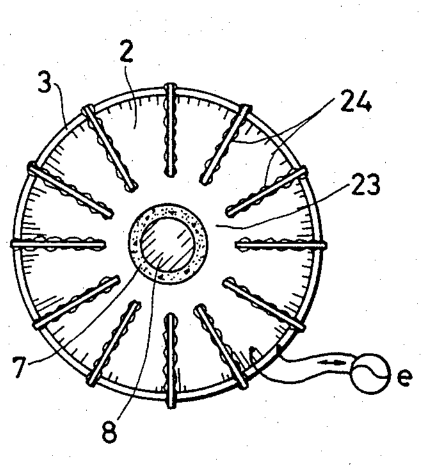
FIG. 7 is a plan view of the piezoelelctric vibrating plate, the peripheral portion of which are provided therein with a plurality of slits for division.

If required, damper pads 16, 28 such as those formed of single-expanded urethane rubber foams may be inserted between the weight 8 or the piezoelectric diaphragm 1 and a fixing member 18 such as a speaker frame, as shown in FIGS. 6(*a*) and 6(*b*), for the purpose of removal of parasitic vibration.

In general, the piezoelectric plate 1 may be in the form of a ring. In the present invention, however, the piezoelectric plate vibrates in the basic concave lens mode, so that expansion/contraction stress occurs mainly at the outer edges to prevent deformation of that diaphragm. This is responsible for increase in $f_{01}$ and hence $Z_1$. To this end that disk is provided by cutting a suitable number (6 to 8) of radially directed slits 24 in the periphery while keeping its central portion 29 intact, into which a viscous material is advantageously filled. This is effective in that, when constructing small-sized equipment such as microphones, small receivers, etc. by the application of the present invention, $Z_1$ can be reduced to an extreme degree with the resulting reductions in the vibration constants of the weight 8($m_2$) and the vicoelastic layers ($c_2$, $r_2$), which lead to improvements in the transducing sensitivity and enlargement of the operational range. In this case, the electrode surfaces of the slits 2 are connected at the central portion 23 with one another, so that the reception of a signal voltage is as simple as is the case with a normal disk.

Figure 8:
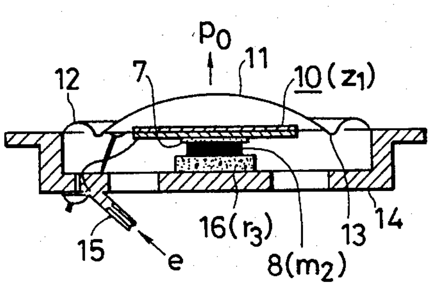
FIGS. 8 to 10 are views showing the examples of electroacoustic transducers to which the piezoelectric vibrating element is applied.

In the following, reference will now be made to one embodiment of the electroacoustic transducer to which the piezoelectric vibrating element 10 of the present invention is applied. In FIG. 8 there is shown the most typical embodiment thereof. An acoustic radiator 11 ($m_2$) in the domed form is rockingly supported on an outer case 14 through a corrugated ring edge ($c_0r_0$) with the outer endge of the element 10 being jointed to the boundary 13 between that element 10 and that edge 12. A signal voltage e is then applied to a terminal for driving. Previously taking the effective mass $m_2$ of the piezoelectric vibrating element 10, an edge compliance ($c_0$) is determined, and the resonance point $f_{00}$ of the domed acoustic radiator 11 is fixed at around 200 to 300 Hz. In the case of an aperture larger than a middle core (50 t0 100 mm), an elastic formed pad 16 may be inserted in between the weight 8 and the bottom of the outer case 14 for the auxiliary purpose. This corresponds to $c_3r_3$ in FIG. 6(*a*), and suppresses an excessive amplitude of the weight 8$m_2$ in a low-frequency range for the removal of parasitic vibration, thus making a contribution to stabilization.

This embodiment is preferable as rain drip-proof speakers and for outdoor equipment for interphones, sound-synthesis alarms and the like.

Figure 9:
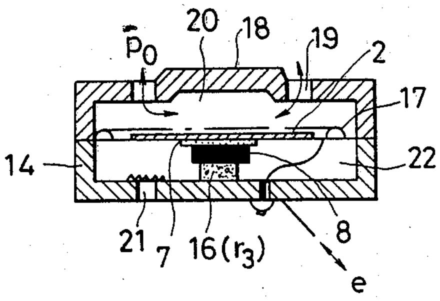

FIG. 9 shows a simplified embodiment wherein the piezoelectric vibrating plate is used direcly as the radiator without recourse to any specific existing radiator, said embodiment being mainly designed to be used for telephone transmitter/receiver combinations. Since the transmission range for telephone circuits is of the order of 300 Hz to 3.5 kHz, that range may be formed in the following manner. For instance, a corrugated ring edge 17 is attached to the outer edge 9 of the metal plate 3 of the piezoelectric vibrating plate to fix a compliance at $c_0$ and a low-frequency resonance point $f_{00}$ at about 300 Hz. On the other hand, the first resonance point $f_{01}$ of the convex lens mode of the piezoelectric vibrating plate 1 is determined at about 3 kHz with fine adjustment being effected by an acoustic circuit mounted on the back. A low-pass filter of about 3.5 kHz is formed by the capacitance of a front chamber 20 and the inertance of an aperture 19 in a cap 18 so as to remove unnecessary high-harmonic sound. A sponge pad 16 ($r_3$) is inserted between the weight 8 and the bottom face of the outer case 14 is to adjust velocity type driving, and prevent low-frequency deterioration which may otherwise occur when the contact of the earpiece with the concha is unsatisfactory, thereby improving the clearness. The embodiment of FIG. 9 may be used substantially direcly for telephone microphones. In that case, an IC amplifier and a surge voltage absorption element may be built in the back chamber 22 for increasing to the call level. It is understood that these may be mounted on the outside. This embodiment is more reliable and serviceable and less moisy than the conventional carbon receiver.

Figure 10:
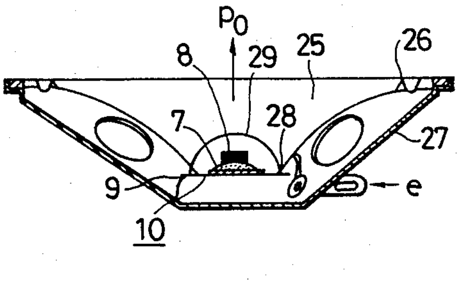

The embodiment of FIG. 10 is generally of a cone type speaker wherein a cone type acoustic radiator 25 is molded of a sheet obtained by paper-making or a plastic film, and is rockingly joined to a frame 27 through a corrugated ring edge 26. The piezoelectric vibrating element 10 is joined on the outer edge 9 to the junction 28 of the top of the radiator 25 and a dome 29, and is provided on its terminal with a signal voltage e so as to drive the radiator 25. This speaker is preferable for use in small-sized pocket radio sets, cassette type tape recorders, etc., if a single voltage is applied thereon through a small-sized boosting transformer, since it can be formed into the lightweight and thin shape on the order of no more than 10 mm. This speaker may also replace permanent magnet type speakers in the event that avoidance of any magnetic flux leakage is desired.

Figure 11A:
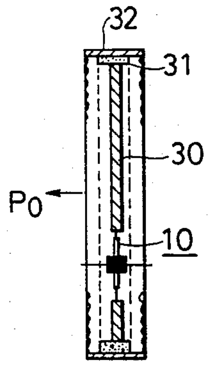
FIG. 11*a* and 11*b* are sectional and plan views of the examples of another electroacoustic transducers to which the piezoelectric vibrating element of the present invention is applied.
Figure 11B:
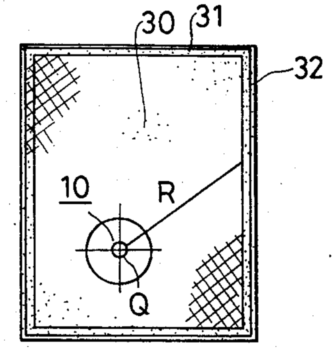
Figure 12:
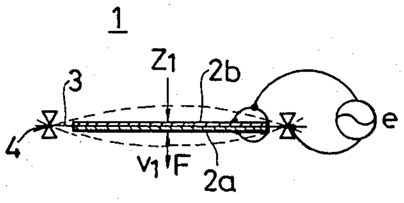
FIG. 12 is a model view showing the basic motion of the piezoelectric vibrating plate.
Figure 13:
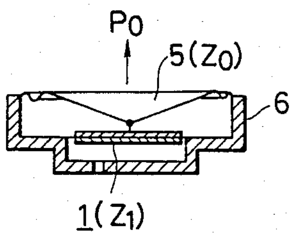
FIG. 13 is a view showing the structure of a small-sized speaker in which the piezoelectric vibrating plate of FIG. 12 is used.
Figure 14:
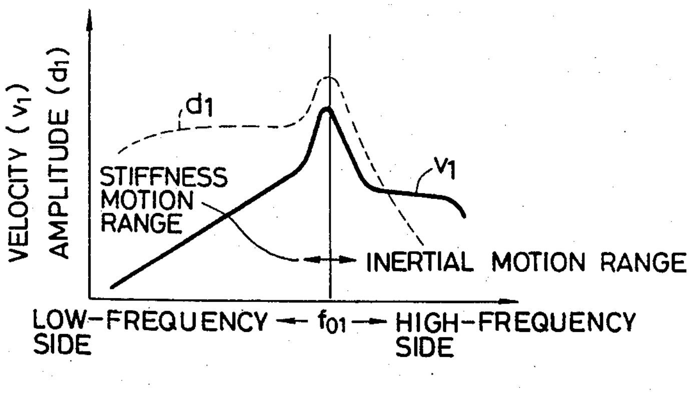
FIG. 14 is a view showing the characteristics of the piezoelectric vibrating plate of FIG. 12.
Figure 15:
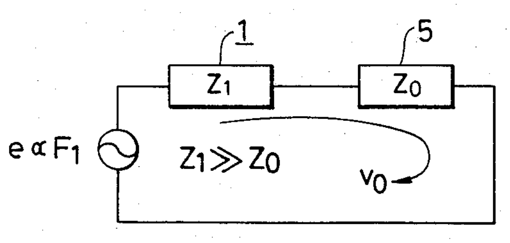
FIG. 15 is an equivalent circuit diagram of the samll-sized speaker of FIG. 13.
Figure 16:
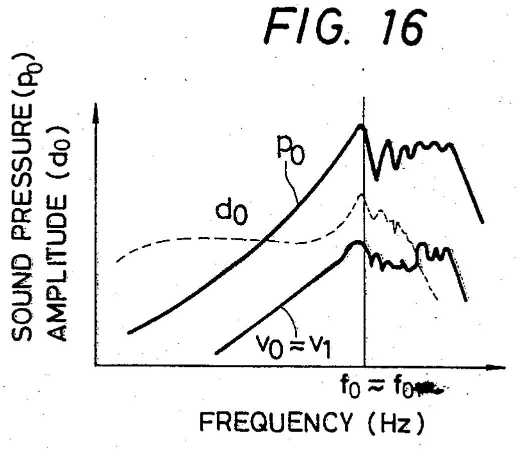
FIG. 16 is a view showing the characteristics of the small-sized speaker of FIG. 13.

In the embodiment of FIG. 11, an acoustic radiator 30 is formed of a semi-hard, foamed flat plate made of syrene foam, etc. The acoustic radiator 30 may be in the rectangular form (having a length-to-width ratio of about 4 to 3) with the edge end being locked onto a frame 32 through a soft foamed member 31. The center Q of the piezoelectric vibrating element 10 is fixed in place at a given selected position at which the distance R leading to the end edge of the radiator 30 differ preferably in the angular direction, so that standing waves occurring frequently in a specific frequency are dispersed. It is understood that the piezoelectric vibrating element 10 is fitted into, and bonded therearound onto, an opening in the acoustic radiator 30. The sensitivity and tone quality of this simple speaker are inferior to those of the cone type speaker as shown in FIG. 10. However, it is best-suited for use as a simple sound generator to be built in electronic musical instruments or toys.

As mentioned in the foregoing, the piezoelectric vibrating element according to the embodiments of the present invention has a weight joined to the vicinity of the center of gravity of a piezoelectric plate through a viscoelastic layer. In a low-sound range, that weight acts as the inertial mass, so that the piezoelectric diaphragm is strongly constrained at the central portion, and so assumes on the concave lens mode with the outermost edges vibrating at the maximum amplitude, thus generating a higher sound pressure in that range. In a high-frequency range, the presence of the viscoelastic layer helps reduce the amount of constraint applied onto the central portion of the piezoelectric plate, so that the signal frequency increases and that plate is driven at the desired constant velocity. Furthermore, vibration is restricted at the resonance point of the piezoelectric plate by the viscous resistance of the viscoelastic layer, whereby a flat output sound pressure is obtained from a low-to high-frequency range. To add to this, there are reduced or limited circuit losses, so that efficient electricity-to-sound conversion is achieved.

Other embodiments of the present invention will now be explained with reference to FIGS. 17 to 20.

Figure 17:
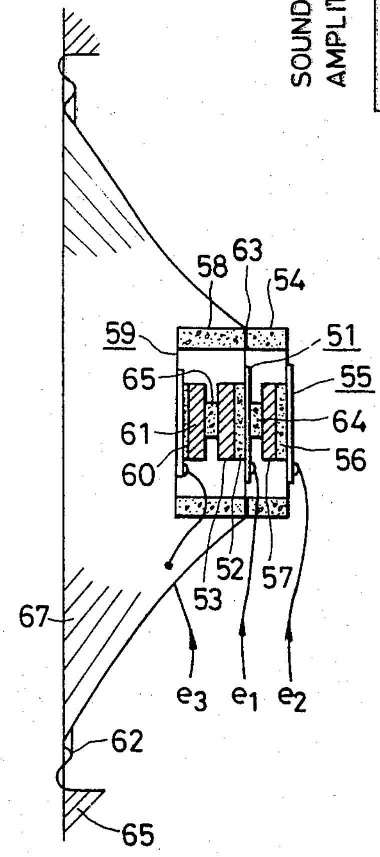
FIG. 17 is a sectional view showing a piezoelectric speaker constructed from a plurality of prezoelectric vibrating elements.

FIG. 17 is a sectional view showing a piezoelectric speaker constructed from a plurality of the piezoelectric vibrating elements according to the present invention. As illustrated in each of FIGS. 17 to 20, piezoelectric vibrating elements 51, 55 and 59 each have weights 53, 57 and 61 joined to the vicinity of the center of gravity through viscoelastic layers 52, 56 and 60, thereby forming composite piezoelectric vibrating elements of the center clamp type. The middle element 51 is joined at the peripheral end 63 directly to the top 63 of a cone type acoustic radiator 67 made of, e.g., paper. The outermost edge of the radiator 67 is rockingly joined at 62 through a corrugated elastic edge 62, and is supported in its entirety.

The outer piezoelectric vibrating elements 55 and 59 have their respective peripheral ends integrally joined to the outer periphery of the middle element 51 through the associated connectors 54 and 58. The rearmost weight 57 is loosely fitted into the center of said element through a viscoelastic connector 64, while the weight 61 is loosely joined to 53 through a connector 65. The respective piezoelectric diaphragm elements used may be of either the monomorph or the bimorph type. However, it is noted that the illustrated embodiment is of the monomorph type with the electromotive forces being in the same phase. The connectors 54 and 58 are formed of a material which is of elasticity, viscous resistance and small mass, and shows reduced transmission losses in various ranges. For instance, they may be made of synthetic rubber such as chloroprene rubber, butyl rubber, etc., and may be in the rectangular or round columnar shape, A circular array of about 6 to 8 of these columns are arranged and bonded onto the peripheral edge of each piezoelectric vibrating element 55 or 59 at regular intervals. The required coefficient of transmission is determined, taking into account the hardness of the rubber material as well as the sectional area, length and number of the small volumns.

Figure 18:
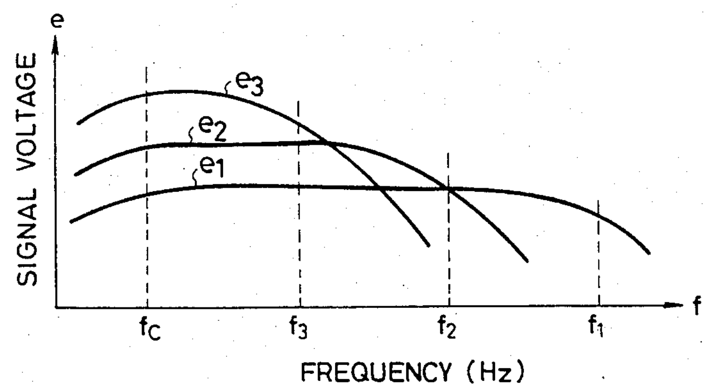
FIGS. 18 and 19 are characteristic diagrams showing the signal voltages applied to the piezoelelctric vibrating elements in the piezoelectric speaker of FIG. 17 and the synthesized sound pressure of the elements.
Figure 19:
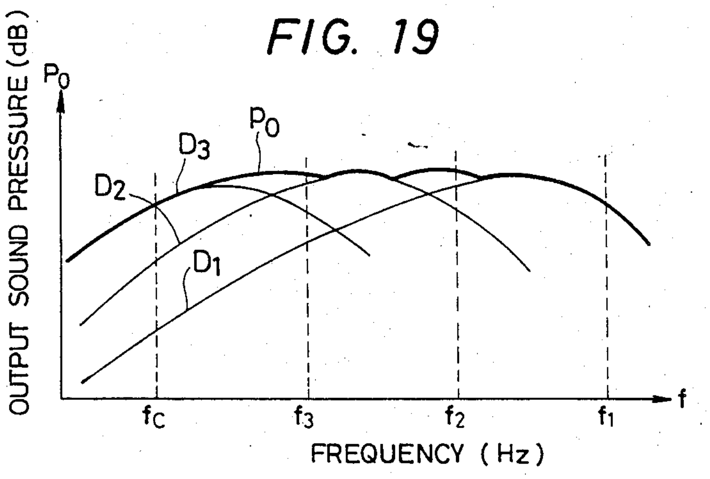

Now, assume that signal valtages $e_1$, $e_2$ and $e_3$ to be applied on the piezoelectric diaphragm elements 51, 55 and 59 are distributed, as generally shown in FIG. 18, corresponding to the divided frequency ranges, and the level of voltage to be applied is predetermined to meet the relation of $e_1<e_2<e_3$ with the intermediate transmission losses in mind. As generally shown in FIG. 19, the piezoelectric vibrating elements 51, 55 and 59 share the high-, middle-, and low-frequency ranges defined between $f_1$–$f_2$, $f_2$–$f_3$ and $f_3$ 0 $f_c$, respectively, whereby generally flat acoustic pressure properties are attained as the radiating acoustic pressure $p_0$, and improvements are introduced into the transducing sensitivity. It is noted that, in the composite type piezoelectric speaker of the present invention, the parasitic oscillations occurring in the middle-frequency range are absorbed into the viscous resistance components of the combined impedances $K_1$ and $K_2$ of the connectors 64 and 65 to such an extent that they disappear substantially.

Figure 20:
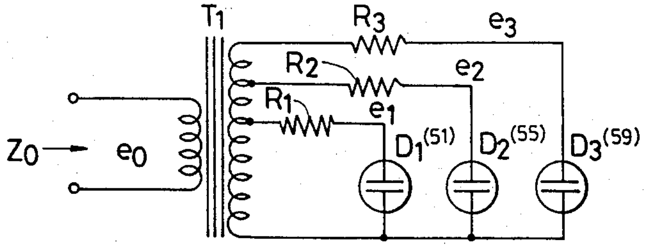
FIG. 20 is a view showing one example of the connection circuit for generating the signal voltages to be applied to the piezoelectric vibrating elements in the piezoelectric speaker of FIG. 17.
Figure 22:
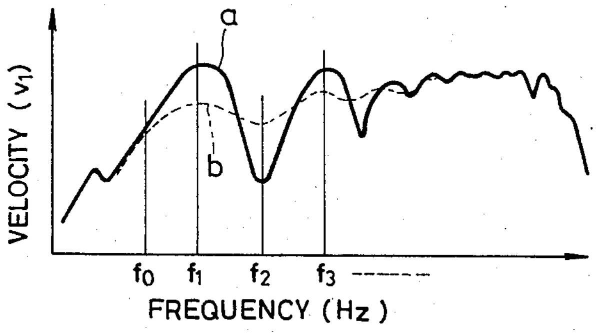
FIG. 22 is a view showing the frequency-response characteristics of the element of FIG. 21A, as compared with those of the conventional one.

In what follows, reference will now be made to the process for generating the signal voltages $e_1$, $e_2$ and $e_3$ to be applied on the piezoelectric vibrating elements 51, 55 and 69 shown in FIG. 22. Since each piezoelectric vibrating element is usually of a capacitance of about 0.1 F and of a reactance of about 15 k$\phi$ at 1 kHz, the impedance of $Z_0$ of the primary coil can be fitted to usual 8 with the use of a boosting transformer $T_1$ having a turn ratio of about 1:10, as illustrated in FIG. 20, whereby the signal voltages $e_1$, $e_2$ and $e_3$ are obtained as the secondary voltages with respect to the primary voltage $e_0$ of the boosting transformer $T_1$.

Another embodiment of the present invention will now be explained with reference to FIGS. 21 to 26.

Figure 21A:
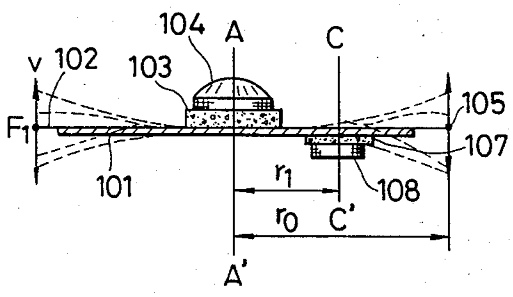
FIG. 21A is a sectional view of the piezoelectric vibrating element used for suppressing the standing wave vibration thereof, which shows another embodiment of the present invention.
Figure 21B:
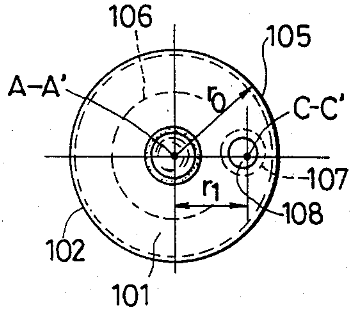
FIG. 21B is a plan view illustrating the vibration mode thereof.

FIG. 21A is a sectional view showing the piezoelectric vibrating element used for suppressing the standing wave vibration thereof, and FIG. 21B is a view illustrating the mode of vibration thereof.

As illustrated in FIG. 21A, the piezoelectric sound radiator is of the unimorph type wherein a piezoelectric plate 101 is applied to a metallic thin sheet 102. The piezoelectric sound radiator includes a main weight 104 joined onto its central axis A—A' through a viscoelastic layer 103. Apart from the main weight 104, an auxiliary weight 108 is joined through a viscoelastic layer 107 onto the eccentric axis C—C' spaced away from the axis A—A" by a distance $r_1$. In this case, the auxiliary weight 108 may be joined to the piezoelectric plate on the same plane as the main weight 104. Alternatively, it may be joined to the piezoelectric plate on the plane opposite to the main weight 104, as illustrated in FIG. 21A. If the auxiliary weight 108 is provided through the viscoelastic layer 107 to the portion corresponding to the peak-to-peak portion of standing wave vibration, an excess of standing wave vibration is absorbed in the viscoelastic resistance of the viscoelastic layer 107. FIG. 22 shows frequency-response curves with respect to a velocity $v_1$. As appreciated from a solid line a, unnecessary standing wave vibration is more effectively mitigated, as compared with the prior art example illustrated by a broken line b. Appropriately, the distance $r_1$ between the central axis A—A' and the eccentric axis C—C' of the piezoelectric sound radiator is about 70–80% of the radius $r_0$ thereof, and the weight of the auxiliary weight 108 is about a half of the main weight 104, usually about 1.2 grams.

Figure 23A:
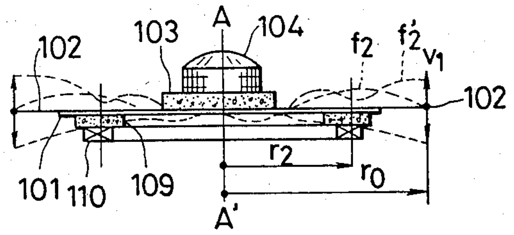
FIG. 23A is a sectional view of the piezoelectric vibrating element used for suppressing the standing wave vibration thereof, which shows a further embodiment of the present invention.
Figure 23B:
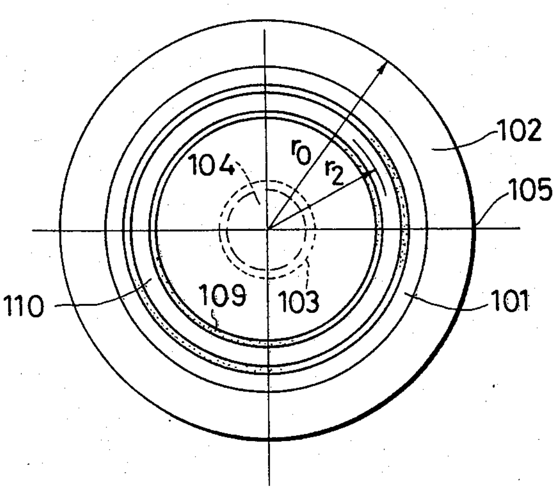
FIG. 23B is a plan view of the rear side of the embodiment of FIG. 23A.

FIG. 23A is a sectional view showing the piezoelectric vibrating element used for suppressing the standing wave vibration of the piezoelectric vibrating elements according to still another embodiment of the present invention, and FIG. 23B is a plan view showing the rear side thereof.

As illustrated in FIG. 23A, on the upper face of the piezoelectric sound radiator, a main weight 104 is joined onto the central axis A—A' through a viscoelastic layer 103. On the rear side thereof, there is joined a ring-type weight 110 through a viscoelastic layer 109 of a substantially similar shape, said weight having a radius of $r_2$. In this case, the ring-type weight 110 may be joined to the piezoelectric vibrating plate on the same plane as the main weight 104. Alternatively, it may be joined to the piezoelectric vibrating plate on the plane opposite to the main weight 104, as shown in FIG. 23A.

When the radius $r_2$ of the right-type weight 110 is selected such that it is located at the portion corresponding to the peak-to-peak portion of standing wave $f_2$ of half-wavelength ($\lambda/2$) shown by a dotted line in FIG. 23A, the reference vibration $f_2$ is transformed into $f'_2$ by the absorption effect of the viscoelastic layer 109, so that an output vibration velocity $v_1$ at the outer end 105 is augmented. As a result, a deep dip of $f_2$ of the curve a shown in FIG. 22 is leveled down. Similarly, a peak of $f_1$ is leveled down. In the long run, the curve a is flattened, as shown by the curve b in FIG. 22.

Figure 24A:
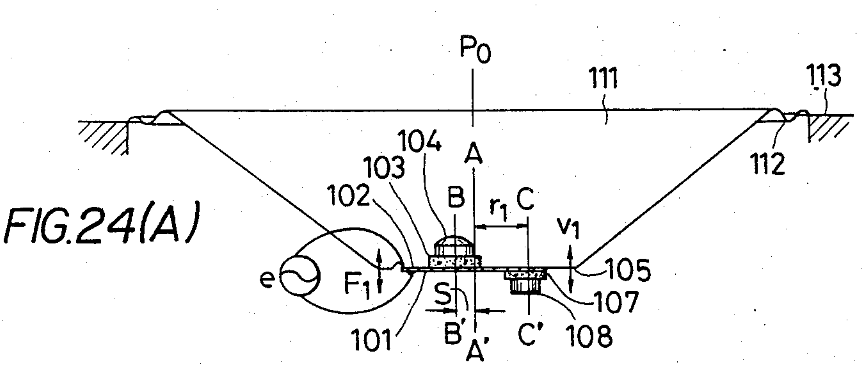
FIG. 24A is a sectional view of the piezoelectric type cone speaker constructed from the piezoelectric vibrating element used for suppressing the standing wave vibration thereof, which shows a still further embodiment of the present invention.
Figure 24B:
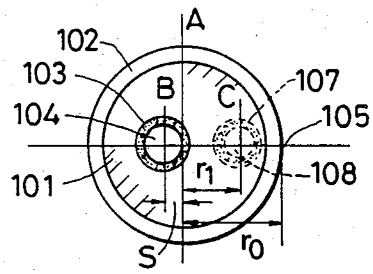
FIG. 24B is a plan view of the rear side of the element of FIG. 24A.
Figure 25A:
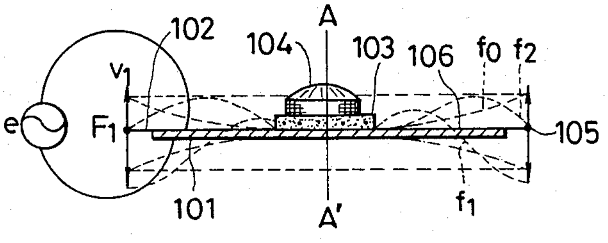
FIG. 25A is a sectional view showing the prior art piezoelectric vibrating element.
Figure 25B:
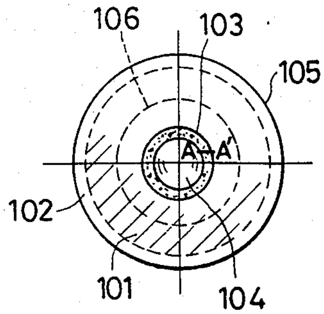
FIG. 25B is a plan view illustrating the vibration mode of the element of FIG. 25A.
Figure 26:
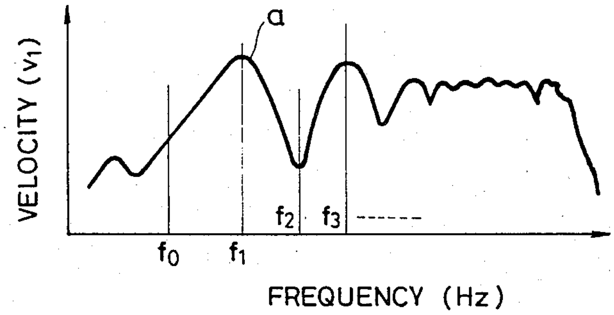
FIG. 26 is a view showing the response characteristics which result from the standing wave of the piezoelectric vibrating element of FIG. 25A, FIGS. 27 to 29 inclusive are perspective and sectional views showing the parts forming the piezoelectric vibrating element showing another embodiment of the present invention.

FIG. 24A is a sectional view of the piezoelectric type cone speaker constructed using the piezoelectric vibrating element used for suppressing the standing wave vibration thereof, which is a further embodiment of the present invention, and FIG. 24B is a plan view of the rear side thereof.

Referring to FIG. 24A, the outer end portion 105 of the piezoelectric vibrating element of the present invention, in which the auxiliary weight 108 shown in FIG. 21A is added, is joined to the turnup of the apex portion of a cone type sound radiator 111, and an opening portion of the radiator 111 is supportably joined to a fixed portion 113 through an elastic edge 112, thereby constructing a piezoelectric type cone speaker. In principle, the main weight 104 may then be located on the central axis A—A'. In some cases, however, it is preferred that the weight 104 is positioned on the axis B—B' which is slightly eccentric with respct to the central axis A—A' by S, for the purpose of leveling down the standing wave vibration that is regularly generated. When S is in excess, uneven vibration is rather induced. Thus, it is preferred that S is limited to at most about 2-3 mm. On the other hand, if the auxiliary weight 108 is positioned on an axis C—C' that is close to the outer end 105 from the axis A—A' by a distance $r_1$, the standing wave vibration is more effectively suppressed by the synergistic effect of the main and auxiliary weights 104 and 108 that are slightly eccentric with respect to each other.

With the thus constructed peizoelectric type cone speaker, when a signal voltage e is applied in between the piezoelectric plate 101 and the metallic thin sheet 102 from the outside, a vibromotive force $F_1$ occurs at the outer end 105 of the piezoelectric vibrating plate to drive the radiator 111 at a velocity $v_1$, so that a radiating sound pressure $P_0$ is generated in the forward direction. Thus, it is possible to realize a piezoelectric cone speacker having improved transduction sensitivity and frequency-response characteristics.

As mentioned in the foregoing, the present invention provides the method for suppressing the standing wave vibration of the piezoelectric vibrating element, wherein a main weight is joined to around the central portion of a piezoelectric sound radiator through a viscoelastic layer, and an auxiliary weight is located inside of the outer end of a piezoelectric vibrating plate, thereby making the vibrating system asymmetrical. Thus, the standing wave vibration occurring on the piezoelectric vibrating plate can more effectively be suppressed.

Further embodiments of the present invention will now be explained with reference to FIGS. 27 to 36.

Figure 27:
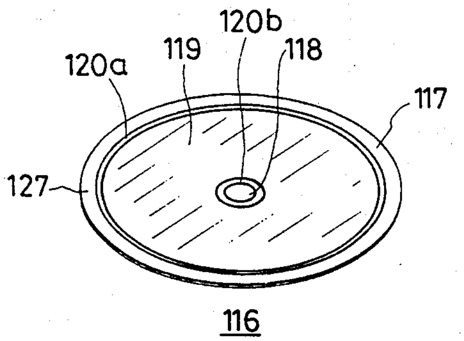
Figure 28:
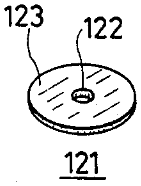
Figure 29:
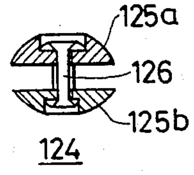

FIGS. 27 to 29 inclusive are perspective and sectional views showing parts forming a further embodiment of the piezoelectric vibrating elements of the present invention. FIG. 27 shows one example of a unimorph type piezoelectric sound radiator 116, which includes a metallic thin sheet 117, to one side of which is applied a piezoelectric plate 119 provided with an electrode. The sound radiator 116 is provided with an small opening 118 in the vicinity of the central portion. In addition, the inner portion 120*b* of the sound radiator 116 adjacent to the small opening 118 is also provided with an elongate insulating portion formed with no electrode surface so as to prevent any discharge from occurring along the surface due to a signal voltage applied. FIG. 28 shows a spacer seat 121 acting as a viscoelastic member, which is formed of an viscoelastic material such as a foamed rubber material, for instance, urethane rubber having a thickness of about 0.8 to 1.0 mm, and is provided on both its sides with skin layers 123 (formed in the process of foaming). FIG. 29 shows a dumbbell type weight 124 which is formed by connecting semi-circular weights 125*a* and 125*b* of equal weight to each other by means of a connection shaft 126. For instance, that weight may be formed of a lead ball having a total weight of about 2 grams.

Figure 30:
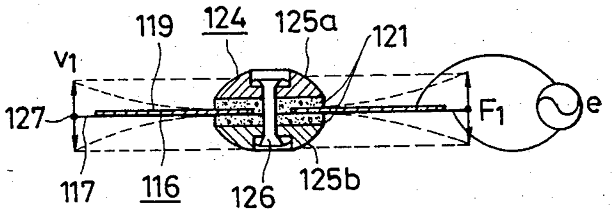
FIG. 30 is a sectional view of the piezoelectric vibrating element, which shows a still further embodiment of the present invention.

Referring to FIG. 30, there is shown a sectional view of the piezoelectric vibrating element which is one embodiment of the present invention. That element is constructed from the parts as illustrated in FIGS. 27 to 29. Referring to the order of assembling, two spacer seats 121 are located at the small opening 118 provided in the vicinity of the central portion of the piezoelectric sound radiator 116 and on both sides thereof. Then, the connecting shaft 126 to which one weight 125*a* is joined is inserted through the small openings 122 in the spacer seats 121, and is fitted into the other weight 125*b* so as to connect tighly both weights 125*a* and 125*b* by means of that shaft 126. It is then noted that a liquid RTV silicone rubber bonding agent is applied over each of the junction surfaces to prevent rattling, and the connecting shaft 126 is not allowed to come in contact with the small opening 118.

In the following, the operation of the piezoelectric vibrating element of FIG. 30 will be explained.

When a signal voltage e is applied in between the metallic thin sheet 117 and the piezoelectric plate 119 from the outside, an expansion/contraction force corresponding to the impressed voltage e occurs on the piezoelectric plate 119 due to the piezo-effect, so that it is transformed with respect to the sheet 117 due to the resulting shearing stress. In the present invention, however, since the mechanical impedance resulting from the weight 124 and the spacer seats 121 of a viscoelastic material is added to around the central portion of the piezoelectric sound radiator 116 is constrained in the vicinity of the central portion thereof. In consequence, the piezoelectric sound radiator is subjected to the reference vibration following the concave lens vibration mode, as indicated by a broken line in the figure. A vibromotive force $F_1$ is then taken out of the outer end 127 of the radiator 116 that vibrates at the maximum amplitude to drive the vibration system at a velocity $v_1$.

Figure 31:
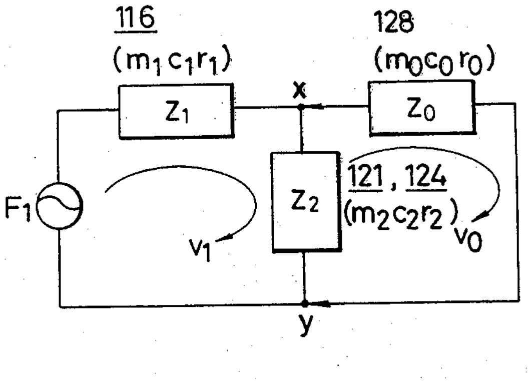
FIGS. 31 and 32 are equivalent circuit diagrams of the piezoelectric vibrating element of FIG. 30 and a part thereof.
Figure 32:
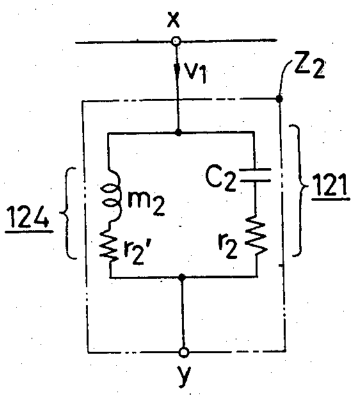

The operation of such a driving system will more clearly be explained with reference to FIGS. 31 and 32 showing equivalent circuit diagrams.

That is to say, an impedance $Z_1$ ($m_1c_1r_1$) that is the piezoelectric sound radiator 116 forms a direct-series circuit with a constrain impedance $Z_2$ ($m_2c_2r_2$) comprising the weight 124 ($m_2$) and the spacer seats 121 ($c_2r_2$), and a velocity $v_1$ in association with the vibromotive force $F_2$ of $Z_1$ is controlled by $Z_2$. Since the internal elements comprise parallel-series elements comprising a mass $m_2$, a compliance $c_2$ and a viscous resistance $r_2$, as shown in FIG. 32, the mass reactance takes main part in the constrain of the piezoelectric sound radator 116 in the vicinity of the central portion thereof in a low-frequency range, so that the outer end 127 thereof vibrates at a larger amplitude. In middle- or high-frequency ranges, however, the degree of said constraint is reduced mainly by the compliance $c_2$ with the result that the outer end 127 vibrates at a smaller amplitude. Hence, the velocity $v_1$ is controlled in response to the operating frequency, thus making it possible to drive the load $Z_0$ connected to the terminals x-y of $Z_2$ at an approximately constant velocity $v_0$.

Figure 33:
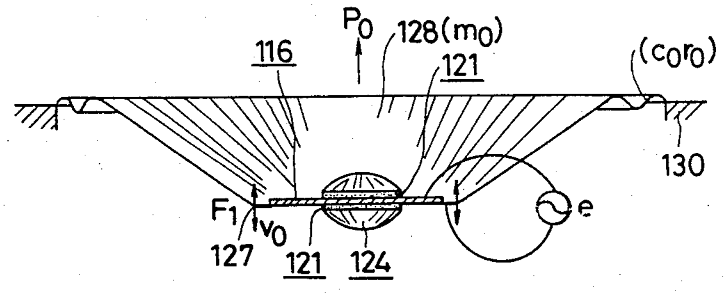
FIG. 33 is a sectional view showing the piezoelectric type cone speaker constructed using the piezoelectric vibrating element of FIG. 30, FIGS. 34 and 35 are a sectional view illustrating the vibration mode of the piezoelectric vibrating element of FIG. 30 and a view showing the frequency-response characteristics thereof.

FIG. 33 is a sectional view of the piezoelectric type cone speaker constructed using the piezoelectric vibrating elements as mentioned above. In the illustrated piezoelectric type cone speaker, the outer end 127 of the piezoelectric sound radiator 116 is joined to the turnup of the apex of a cone type sound radiator 128 ($m_0$) of an appropriate size, the outer edge of which is joined to a fixed member 130 through an elastic edge 129 ($c_0r_0$). If the cone type sound radiator 128 is now driven at a constant velocity $v_0$, a constant sound pressure $P_0$ is in principle radiated in the forward direction. In the equivalent circuit diagram of FIG. 31, it is noted that the impedance $Z_0$ ($m_0c_0r_0$) of the cone type sound radiator 128 is connected to the terminals x and y of the constrain impedance $Z_2$ ($m_2c_2r_2$).

Figure 34:
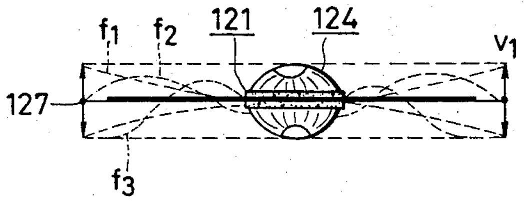
Figure 35:
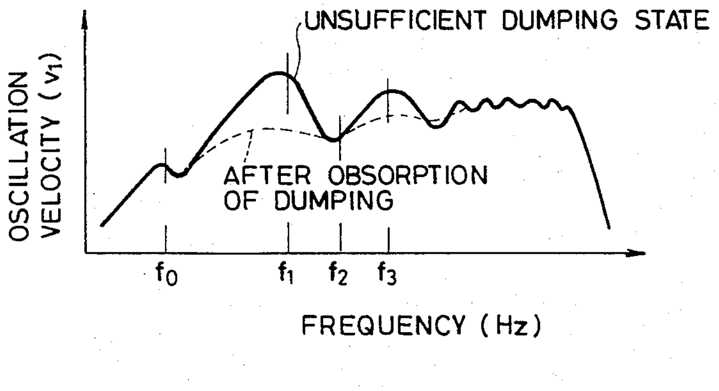

FIG. 34 is a sectional view illustrating the vibration mode of the piezoelectric vibration mode of FIG. 30. In the illustrated piezoelectric element, the piezoelectric sound radiator 116 is a laminate comprising the piezoelectric plate 119 and the metallic thin sheet 117. For that reason, standing wave vibration occurs in addition to the reference vibration due to the fact that the so-called resonance sensitivity Q is high. For instance, a plurality of articulation vibrations such as $f_1$ to $f_3$ shown by broken lines in FIG. 34 occur in a low-frequency range, and the resulting frequency response of the velocity $v_1$ of the outer end 127 of the piezoelectric sound radiator 116 is as illustrated by a solid line in FIG. 35, so that prominent sinusoidal characteristics with the maximum and minimum occur predominantly in a lowrequency range. In consequence, the application of that radiator to speakers, etc. may be unpreferred, since the frequency response is disturbed with deterioration of tone quality. On the other hand, the point to see here is that the aforesaid articulation standing wave vibrations have an important effect upon decreases in the dynamic impedance of the radiator 116 and increases in the transduction sensitivity thereof. Thus, the articulation vibrations should not unconditionally be suppressed. In the present invention, the standing wave vibration is absorbed depending upon the damping action of the viscous resistance $r_2$ of two spacer seats 121, as shown in FIG. 30. Consequently, the selection of the material forming the spacer seats 121 is difficult. Appropriately, that material is of dynamic viscous resistance, and should have a low temperature coefficient and only undergo less influence from changes in the external temperature. However, there are only a limited number of materials having a stable coefficient of viscoelasticity. As a result of experimental investigations made by the present invent or, it has been found that a satisfactory material is a foamed mass of a butyl rubber base synthetic material having a thickness of about 0.8 to 1.0 mm and fine foams therein. More satisfactory is a material having a skin on its surface. However, even the aforesaid butyl rubber foamed mass shows insufficient viscoelastic characteristics under severe temperature conditions.

Figure 36:
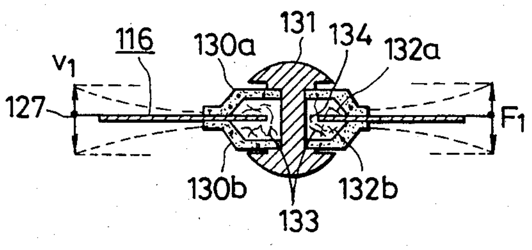
FIG. 36 is a sectional view showing the piezoelectric vibrating element, which is a still further embodiment of the present invention, As illustrated in FIG. 2, $z_2$ is expressed in terms of parallel elements of inertial mass $m_2$ and viscoelatic resistances $c_2$ and r and its impedance may generally be in the range defined in terms of $z_1 >> z_0 \leqq z_2$, although varying depending upon the required conditions such as, for instance, the operation range, the transducing sensitivity, etc.

FIG. 36 is a sectional view showing a further embodiment of the peizoelectric vibrating element of the present invention. The illustrated piezoelectric sound radiator 116 is of a structure similar to that of FIG. 30. That radiator 116 is provided around the central portion thereof with a small opening 118, which is laminated on both its sides with two bowl-like spacer seats **130*a* and 130*b* based on rubber, to thereby define two small chambers 132*a* and 132*b*. The chambers 132*a* and 132*b* are allowed to communicate with each other through a narrow space 134 defined by a shaft 131 for connecting two weights together in integral relation and the circumference of the small opening 118. Each of the chambers 132*a* and 132*b* is filled therein with silicone oil 133 (having a dynamic viscosity of about 1,000 cPs) that is viscous oil. For that reason, the silicon oil 133 is allowed to flow alternately between the upper and lower chambers 132*a* and 132*b* through the narrow space 134. In this embodiment, the viscous resistance of that oil is utilized, when it flows. It is then possible to attain the required viscous resistance in a wider range at one's disposal by controlling the viscosity of the silicone oil 133 and the narrow space 134. In addition, since the silicone oil 133** is a stable material as expressed in terms of the dynamic viscosity whose temperature dependence is comparable to that of pure water. Thus, that oil is more stable than the aforesaid butyl rubber in viscosity, and so stands up to external severe temperature conditions.

In the piezoelectric vibration element according to the embodiment as mentioned just above, two weights are joined to each other through the associated viscoelastic layers by means of a connecting shaft extending through a small opening formed in around the central portion of a piezoelectric vibrating plate so as to constrain the substantially central portion of that plate. Thus, stable vibration is achieved even when the external temperature changes. In addition, assembling is so easy that highly reliable products are supplied at a low price.

What is claimed is

1. A piezoelectric vibrating element which includes a piezoelectric vibrating plate and a weight connected to near the point of center of gravity thereof through a visco-elastic layer, and in which the vibramotive force of said piezoelectric vibrating plate is taken out of the outer edge thereof.

2. The element as defined in claim 1, in which said viscoelastic layer is formed of a finely foamed material such as butyl rubber, urethane rubber and silicon rubber.

3. The element as defined in claim 1, in which said weight comprises an arrangement of a main columnar weight and an annular sub-weight.

4. The element as defined in claim 1, in which said weight is connected through a viscoelastic layer to a thin column provided onto a metal plate forming said piezoelectric vibrating plate.

5. The element as defined in claim 1, in which said piezoelectric vibrating plate in the disk-like form is provided in the outer periphery with a radial array of fine gaps by cutting, said fine gaps being filled with a viscous material, thereby dividing it into a plurality of even fine pieces.

6. A piezoelectric speaker including a plurality of piezoelectric vibrating elements, each including a piezoelectric vibrating plate and a weight connected to near the point of center of gravity thereof through a viscoelastic layer, and having the vibramotive force designed to be taken out of the outer edge thereof, which are connected at their peripheral ends to each other through connectors, one of said elements being connected at its peripheral edge directly to a cone type acoustic radiator to give thereto a vibramotive force mainly in a high-frequency portion, and the remaining elements adjacent thereto producing a vibramotive force adapted to share middle- and low-frequency portions for energization of said cone type acoustic radiator.

7. The speaker as defined in claim 6, in which, of said plurality of piezoelectric vibrating elements, the element connected directly to said cone type acoustic radiator is mainly designed to share and energize the high-frequency portion, while other elements adjacent thereto are mainly adapted to share and energize the middle- and low-frequency portions.

8. A piezoelectric speaker including a piezoelectric vibrating element designed in such a manner that a main weight is joined to the vicinity of the central portion of a piezoelectric sound radiator through a viscoelastic layer, so that said radiator is constrained at around the central portion thereof to take a vibromotive force out of the outer end thereof, wherein an auxiliary weight is located inside of the outer end of said radiator, and is joined in place through a viscoelastic layer.

9. A piezoelectric speaker as defined in claim 8, in which a ring-type weight forming said auxiliary weight is substantially concentrically joined to said main weight through a viscoelastic layer.

10. A piezoelectric speaker including a piezoelectric vibrating element, wherein each of two weights is joined to the vicinity of the central portion on each side of a piezoelectric sound radiator through a viscoelastic layer, said weights being joined to each other through the associated viscoelastic layers by means of a connecting shaft extending through a small opening formed in the vicinity of the central portion of the piezoelectric sound radiator, so that said radiator is constrained at around the central portion thereof to take a vibromotive force out of the outer end of said radiator.

11. A piezoelectric speaker as defined in claim 10, in which said viscoelastic layer used are formed of a member consisting of a synthetic rubber foamed material having fine foams therein.

12. A piezoelectric speaker as defined in claim 10, in which two bowl-like spacer seats are used as said viscoelastic members, and are laminated onto both sides of a small opening formed in said radiator to form two small chambers, which are in turn filled therein with a viscous oil, said oil being allowed to flow through a space defined by said small opening and said connecting shaft to make use of the viscous resistance obtained during said flowing.

* * * * *

UNITED STATES PATENT AND TRADEMARK OFFICE

CERTIFICATE OF CORRECTION

PATENT NO. : 4,654,554

DATED : March 31, 1987

INVENTOR(S) : Kanesuke KISHI

It is certified that error appears in the above-identified patent and that said Letters Patent is hereby corrected as shown below:

ON THE TITLE PAGE

The assignment data should be corrected to read as follows:

[73] Assignee: Sawafuji Dynameca Co., Ltd., Tokyo, Japan, part interest.

Signed and Sealed this

Twenty-fourth Day of December, 1991

*Attest:*

HARRY F. MANBECK, JR.

*Attesting Officer*

*Commissioner of Patents and Trademarks*